(12) United States Patent
Shin

(10) Patent No.: US 7,390,743 B2
(45) Date of Patent: Jun. 24, 2008

(54) METHODS FOR FORMING A STRUCTURED TUNGSTEN LAYER AND FORMING A SEMICONDUCTOR DEVICE USING THE SAME

(75) Inventor: Yun-Chul Shin, Yongin-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 157 days.

(21) Appl. No.: 11/282,594

(22) Filed: Nov. 21, 2005

(65) Prior Publication Data

US 2006/0110921 A1 May 25, 2006

(30) Foreign Application Priority Data

Nov. 22, 2004 (KR) .............................. 2004-95863

(51) Int. Cl.
*H01L 21/3213* (2006.01)
(52) U.S. Cl. ................. 438/680; 438/685; 438/699; 438/700; 438/761; 438/778
(58) Field of Classification Search ................. 438/680, 438/685, 694, 699, 700, 761, 778, FOR. 388, 438/FOR. 395, FOR. 405
See application file for complete search history.

(56) References Cited

U.S. PATENT DOCUMENTS

| 2003/0104126 | A1 | 6/2003 | Fang et al. | |
| 2005/0106859 | A1* | 5/2005 | Kim et al. | 438/655 |
| 2005/0250271 | A1* | 11/2005 | Wang et al. | 438/197 |
| 2005/0280118 | A1* | 12/2005 | Lin et al. | 257/618 |
| 2006/0054968 | A1* | 3/2006 | Lee | 257/327 |

FOREIGN PATENT DOCUMENTS

| KR | 10-2002-0010821 | 2/2002 |
| KR | 10-2004-0059939 | 7/2004 |

* cited by examiner

*Primary Examiner*—George Fourson
*Assistant Examiner*—Joannie A Garcia
(74) *Attorney, Agent, or Firm*—Lee & Morse, P.C.

(57) ABSTRACT

A method for forming a structured tungsten layer and a method for forming a semiconductor device using the same. A first tungsten layer is formed with an atomic layer deposition (ALD) method. A second tungsten layer is formed on the first tungsten layer with a chemical vapor deposition (CVD) method. A third tungsten layer is formed on the second tungsten layer with the ALD method to complete the structured tungsten layer.

20 Claims, 5 Drawing Sheets

METHODS FOR FORMING A STRUCTURED TUNGSTEN LAYER AND FORMING A SEMICONDUCTOR DEVICE USING THE SAME

BACKGROUND OF THE INVENTION

1. Field of the Invention

The present invention relates to a semiconductor manufacturing method. More particularly, the present invention relates to methods for forming a structured tungsten layer and forming a semiconductor device using the same.

2. Description of the Related Art

In a semiconductor device, plugs and interconnections are typically formed of low resistance material, e.g., metals such as aluminum, copper or tungsten. Tungsten may exhibit good step coverage and, accordingly, the use of tungsten has increased as semiconductor devices have become more highly integrated and critical dimensions have been reduced. The use of tungsten also has other advantages as a result of its various other properties, e.g., a relatively high melting point of more than 3400° C. and a strong resistance to electromigration.

In a semiconductor device, a tungsten layer is typically formed using a chemical vapor deposition (CVD) method or an atomic layer deposition (ALD) method. Forming a tungsten layer for interconnections or contact plugs by ALD may require significant process time, which may result in reduced manufacturing throughput. Therefore, the CVD method may be preferred, because this method typically can be carried out in less time.

However, the CVD method typically exhibits poorer step coverage than the ALD method. In order to accommodate the various deficiencies in these methods, tungsten layers have been formed using ALD to provide nucleation, and then forming a bulk layer of tungsten to a desired thickness using CVD. However, the resulting tungsten layer may have an upper surface that is very rough and nonuniform, as illustrated in FIG. 1.

If a tungsten layer having a nonuniform upper surface is formed using this conventional process, various defects may result. For example, where subsequent processes are performed, particles may remain at recessed regions of the rough upper surface, which may give rise to various problems. In addition, if another interconnection or conductive plug is formed during a subsequent process on the tungsten layer produced by this conventional method, voids may be formed on the upper surface that can cause problems, e.g., contact failures, a rise in interfacial resistance, etc. Further, the problems caused by the rough upper surface may become more serious as semiconductor devices become more highly integrated.

SUMMARY OF THE INVENTION

The present invention is therefore directed to a method of forming a structured tungsten layer, and a method of forming a semiconductor device using the same, which substantially overcomes one or more of the problems due to the limitations and disadvantages of the related art. A structured tungsten layer formed according to the methods of the present invention may exhibit improved step coverage and a smooth upper surface, and the methods may improve manufacturing throughput.

It is therefore a feature of an embodiment of the present invention to provide a method for forming a structured tungsten layer using atomic layer deposition, chemical vapor deposition and atomic layer deposition sequentially.

It is therefore another feature of an embodiment of the present invention to provide a method for forming semiconductor device including a structured tungsten layer.

It is therefore a further feature of an embodiment of the present invention to provide an apparatus for forming a structured tungsten layer.

At least one of the above and other features and advantages of the present invention may be realized by providing a method for forming a structured tungsten layer including forming a first tungsten layer using a first atomic layer deposition, forming a second tungsten layer directly on the first tungsten layer using chemical vapor deposition, and forming a third tungsten layer directly on the second tungsten layer using a second atomic layer deposition.

Forming the first and third tungsten layers may include repeating: supplying a reducing gas, purging by supplying a purge gas, supplying a tungsten source gas, and purging by supplying a purge gas. Forming the first and third tungsten layers may involve atomic layer deposition at a temperature ranging from about 300° C. to about 350° C. The reducing gas may include monosilane, disilane, silicon tetrafluoride, and/or dichlorosilane and the tungsten source gas may include tungsten hexafluoride and/or tungsten carbon oxide. The purge gas may include nitrogen, argon, and/or helium.

Forming the second tungsten layer may involve chemical vapor deposition using hydrogen and tungsten hexafluoride and may be performed at a temperature ranging from about 370° C. to about 420° C. Forming the first tungsten layer, forming the second tungsten layer, and forming the third tungsten layer may each performed at a pressure ranging from about 36 to about 44 Torr.

At least one of the above and other features and advantages of the present invention may also be realized by providing a method for forming a semiconductor device including forming an interlayer insulating layer on a semiconductor substrate, forming a first tungsten layer on the interlayer insulating layer using a first atomic layer deposition, forming a second tungsten layer directly on the first tungsten layer using chemical vapor deposition, forming a third tungsten layer directly on the second tungsten layer using a second atomic layer deposition, and sequentially etching the third tungsten layer, the second tungsten layer and the first tungsten layer to form a structured tungsten pattern on the interlayer insulating layer.

The interlayer insulating layer may have a contact hole exposing the semiconductor substrate, the first tungsten layer may be formed to conformally cover an inner surface of the contact hole, and the second tungsten layer may be formed to completely fill the contact hole.

The method may also include forming a contact plug to contact the semiconductor substrate through the interlayer insulating layer, prior to forming the first tungsten layer, wherein the structured tungsten pattern is formed to overlap and electrically couple to the contact plug.

Forming the first and third tungsten layers may include sequentially repeating supplying a reducing gas, purging by supplying a purge gas, supplying a tungsten source gas, and purging by supplying a purge gas. Forming the first and third tungsten layers may be performed at a temperature ranging from about 300° C. to about 350° C. The reducing gas may include monosilane, disilane, silicon tetrafluoride, and/or dichlorosilane. The tungsten source gas may include tungsten hexafluoride and/or tungsten carbon oxide. The purge gas may include nitrogen, argon, and/or helium.

Forming the second tungsten layer may include providing hydrogen and tungsten hexafluoride and forming the second tungsten layer may be performed at a temperature ranging from about 370° C. to about 420° C. Forming the first tungsten layer, forming the second tungsten layer, and forming the third tungsten layer may each performed at a pressure ranging from about 36 to about 44 Torr.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
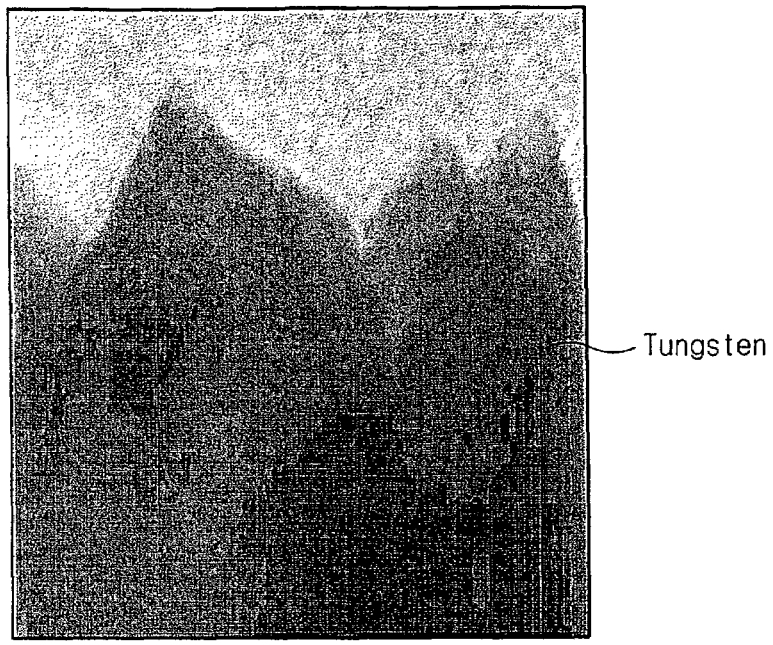
FIG. 1 illustrates a cross-section of a tungsten layer formed using a conventional chemical vapor deposition method.

Korean Patent Application No. 2004-95863, filed on Nov. 22, 2004, in the Korean Intellectual Property Office, and entitled: "Methods for Forming Tungsten Layer and Forming Semiconductor Device Using the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
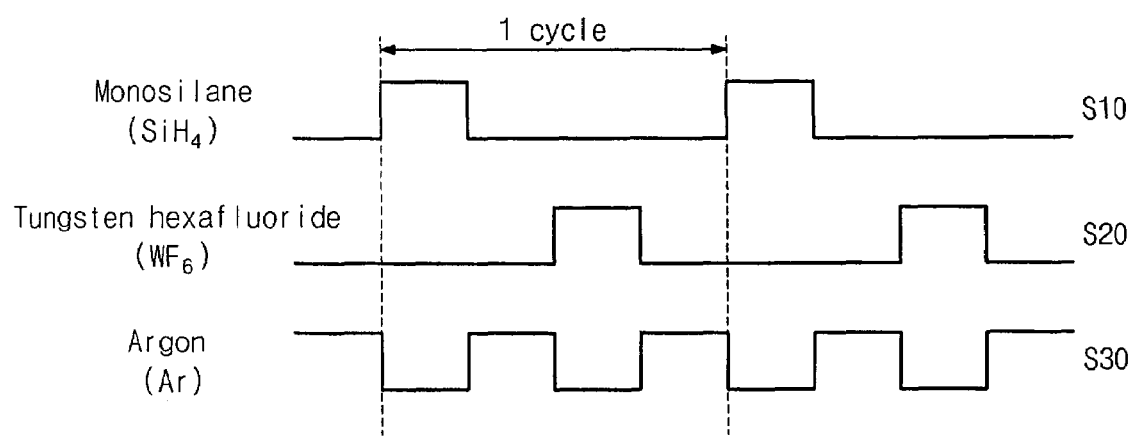
FIG. 2 illustrates a timing diagram for gas supply for atomic layer deposition in a method of forming a structured tungsten layer, in accordance with an embodiment of the present invention.
Figure 3:
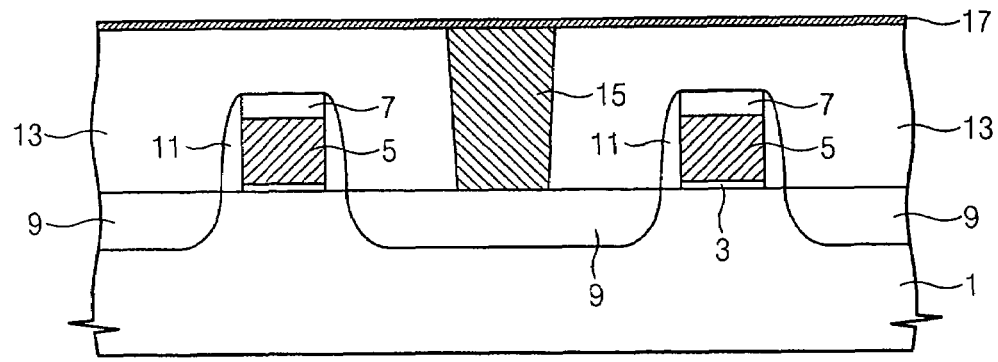
FIGS. 3 to 6 illustrate stages in a method of forming a semiconductor device including a structured tungsten layer, in accordance with an embodiment of the present invention.

FIG. 2 illustrates a timing diagram for gas supply for atomic layer deposition (ALD) in a method of forming a structured tungsten layer, in accordance with an embodiment of the present invention. FIGS. 3 to 6 illustrate stages in a method of forming a semiconductor device including a structured tungsten layer, in accordance with an embodiment of the present invention. Referring to FIG. 3, a device isolation layer (not shown) may be formed on a semiconductor substrate 1 to define an active region. A gate pattern including a gate oxide layer 3, a gate electrode 5 and a capping layer pattern 7 may be formed on the semiconductor substrate 1. A lightly doped drain (LDD) region (not shown) of the semiconductor substrate 1 may be formed at both sides of the gate pattern using the gate pattern as an ion implantation mask. A spacer 11 covering a sidewall of the gate pattern may be formed, and an ion implantation process may be performed using the gate pattern and the spacer 11 as an ion implantation mask to form a source/drain region 9 at the active region.

An interlayer insulating layer 13 may be formed on the semiconductor substrate 1. The interlayer insulating layer 13 may be, e.g., an oxide material. The interlayer insulating layer 13 may be patterned to form a contact hole exposing the source/drain region 9. A conductive layer may be formed to fill the contact hole and planarize the same so that a contact plug 15 may be formed in the contact hole.

Referring to FIGS. 2 and 3, according to an embodiment of the present invention, after formation of the contact plug 15, an ALD process may be performed to form a first tungsten layer 17 on the resulting structure. The ALD process may be implemented using the gas supplying order illustrated in FIG. 2. The method for forming the first tungsten layer 17 may involve the following. The wafer may be loaded in a reactor and heated to a process temperature. The process temperature may be between about 300° C. and about 350° C., e.g., about 325° C., and the process pressure may be maintained uniformly between about 36 Torr and about 44 Torr, e.g., about 40 Torr. A monosilane (silane, $SiH_4$) gas may be supplied as indicated by the first timing change in S10 in FIG. 2. The supplied monosilane may adsorb silicon on the substrate 1 to operate as a growth nucleation site during subsequent deposition of tungsten. A purge gas, e.g., argon (Ar) gas, may supplied to purge any remaining, unreacted monosilane gas, as indicated by S30 in FIG. 2. After the purging step is completed, a tungsten source gas, e.g., tungsten hexafluoride ($WF_6$) gas, may be supplied, as indicated by the first timing change in S20 in FIG. 2. The absorbed silicon may react with and be replaced by tungsten hexafluoride, whereby fluorine may also react with silicon to yield silicon tetrafluoride ($SiF_4$). Accordingly, a single atomic layer of tungsten may be formed.

Next, argon gas may again be supplied, whereby any unreacted materials, silicon tetrafluoride, tungsten hexafluoride, etc. may be purged, as indicated by S30 in FIG. 2. This may complete one cycle of the process. The first tungsten layer 17 in FIG. 3 may be formed to a desired thickness by repeating the above-described cycle several times.

Figure 4:
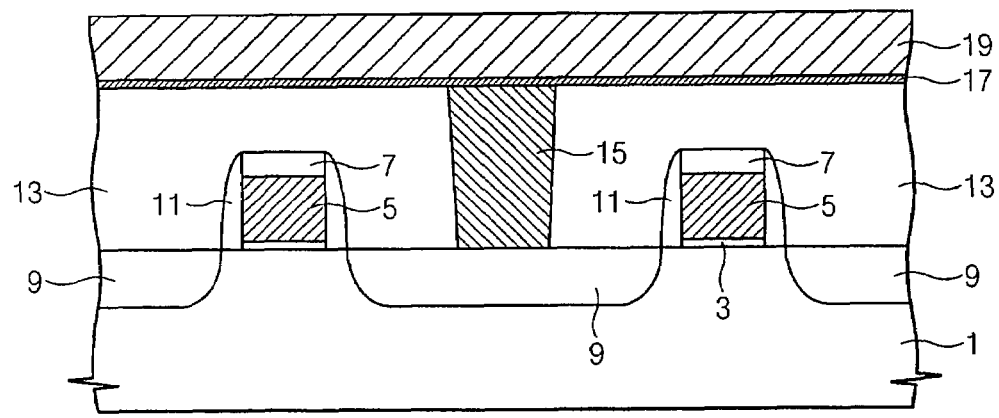

Referring to FIG. 4, a second tungsten layer 19 may be formed on the first tungsten layer 17. The second tungsten layer 19 may be formed directly on the first tungsten layer 17. The second tungsten layer 19 may be formed by using, e.g., chemical vapor deposition (CVD) that includes supplying hydrogen and tungsten hexafluoride gas at a temperature between about 370° C. and about 420° C., e.g., about 395° C. The pressure may be between about 36 Torr and about 44 Torr. Tungsten may be deposited and the hydrogen may combine with fluorine from the tungsten hexafluoride to form volatile hydrofluoric acid (HF). The second tungsten layer 19 may be formed thicker than the first tungsten layer 17 using CVD, and it may be formed at a higher rate. Therefore, manufacturing throughput may be improved.

Figure 5:
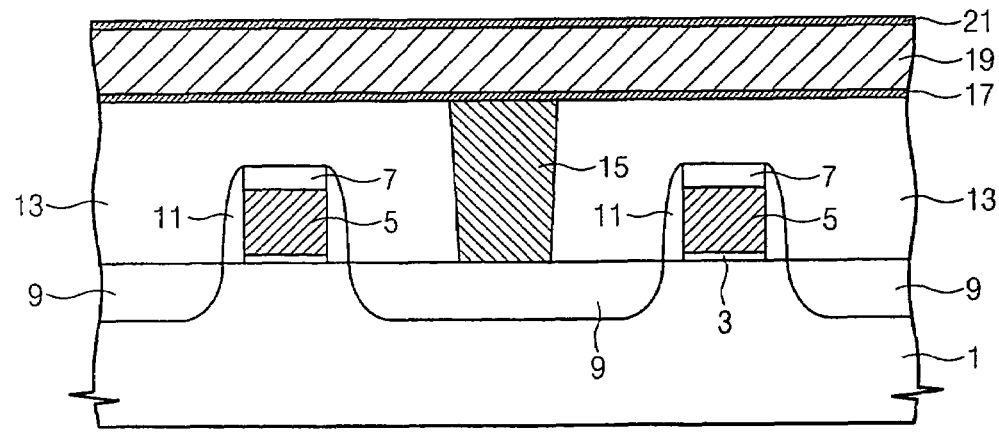

Referring to FIGS. 2 and 5, a third tungsten layer 21 may be formed on the second tungsten layer 19 using ALD. The third tungsten layer 21 may be formed directly on the second tungsten layer 19. The method for forming the third tungsten layer 21 is preferably the same as the method for forming the first tungsten layer. Thus, forming the third tungsten layer 21 may include supplying monosilane, purging using argon gas, supplying tungsten hexafluoride, and purging again using argon gas. This cycle may be repeated several times to form the third tungsten layer 21 to a desired thickness. By forming the third tungsten layer 21 using ALD, it may be formed of one or more smooth and dense tungsten atomic layers.

Figure 6:
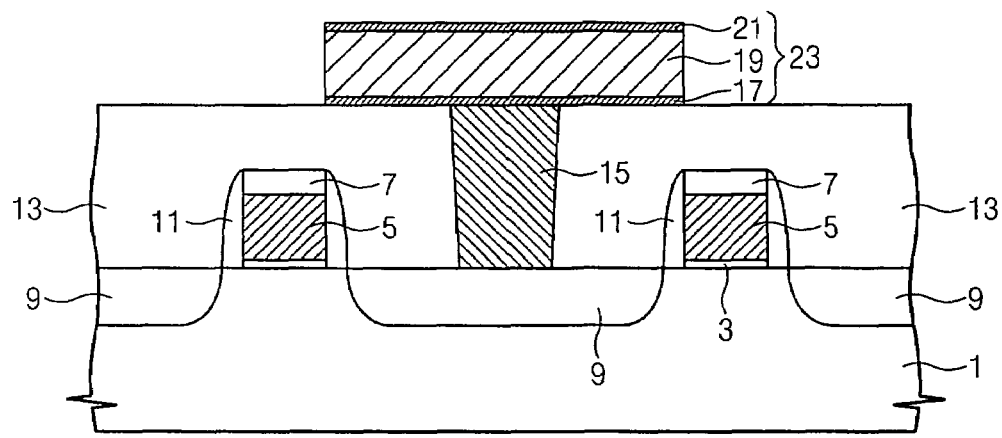

Referring to FIG. 6, the third tungsten layer 21, the second tungsten layer 19 and the first tungsten layer 17 of the structured tungsten layer may be sequentially etched to form a structured tungsten pattern 23. The pattern 23 may be, e.g., an interconnection, a pad of a bit line of a DRAM device, etc. An interlayer insulating layer (not shown) may be subsequently formed and patterned, and a via hole exposing the pattern 23 may be formed. The via hole may be filled with a conductive material to form a plug (not shown). As an uppermost layer of the structured tungsten pattern 23 formed according to the present invention, i.e., an upper surface of the third tungsten layer 21, may exhibit uniform density and smoothness, it may be possible to reduce or prevent failures arising at this stage in the process.

Figure 7:
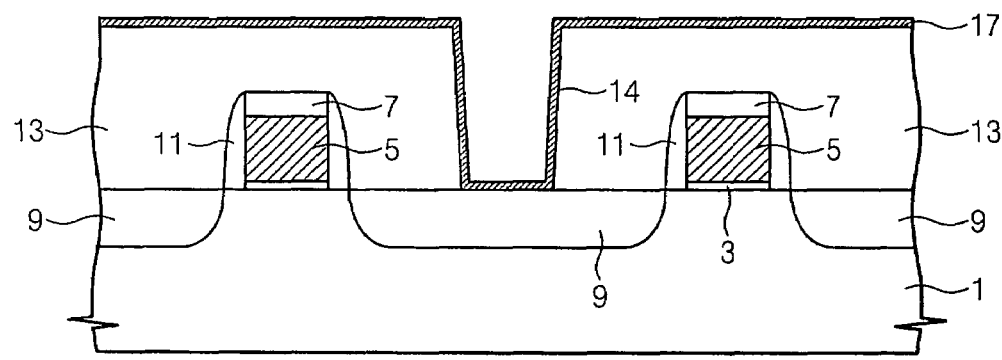
FIGS. 7 to 10 illustrate stages in a method of forming a semiconductor device including a structured tungsten layer, in accordance with another embodiment of the present invention.

FIGS. 7 to 10 illustrate stages in a method of forming a semiconductor device including a structured tungsten layer, in accordance with another embodiment of the present invention. Referring to FIGS. 2 and 7, gate patterns and a source/drain region 9 may be formed on a semiconductor substrate 1, and an interlayer insulating layer 13 may be formed thereon. The interlayer insulating layer 13 may be patterned to form a contact hole 14 exposing the source/drain region 9. A barrier layer (not shown) may be formed on a front surface of the semiconductor substrate and may include one or more layers such as, e.g., titanium (Ti), tantalum (Ta), titanium nitride (TiN), tantalum nitride (TaN), etc. According to the methods of the present invention, the first tungsten layer 17 may be conformally formed with an ALD method. As in the ALD method illustrated in FIGS. 2 and 3, a cycle including supplying monosilane S10, purging S30, e.g., with argon gas, supplying a tungsten hexafluoride gas S20 and again purging S30, e.g., with argon gas, may be repeated several times. As ALD may exhibit good step coverage, the first tungsten layer 17 may be conformally and uniformly formed in the contact hole 14.

Figure 8:
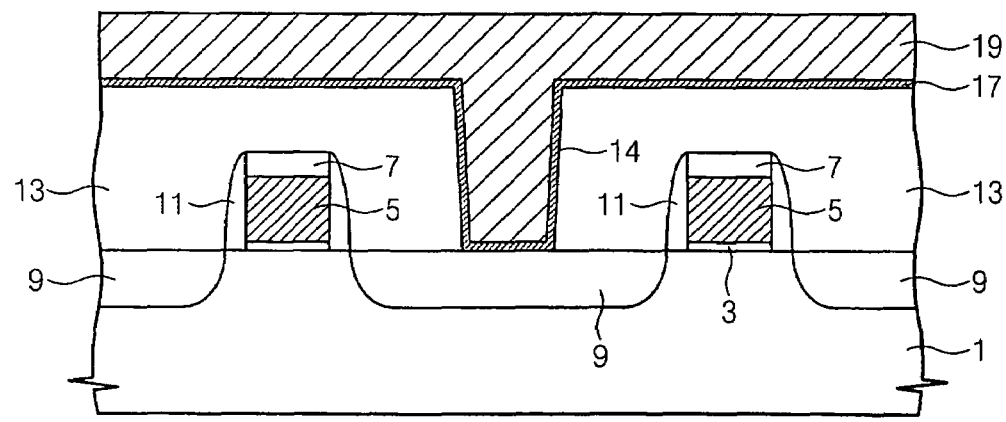

Referring to FIG. 8, CVD may be used to form a second tungsten layer 19 so as to fill the contact hole 14. The second tungsten layer 19 may be formed directly on the first tungsten layer 17. The CVD may include using hydrogen and tungsten hexafluoride. If the second tungsten layer 19 is formed on the first tungsten layer 17 using CVD, the step coverage may be significantly improved relative to using CVD to form a tungsten layer without the first tungsten layer, and the second tungsten layer 19 may be formed to fill the contact hole 14 without voids.

Figure 9:
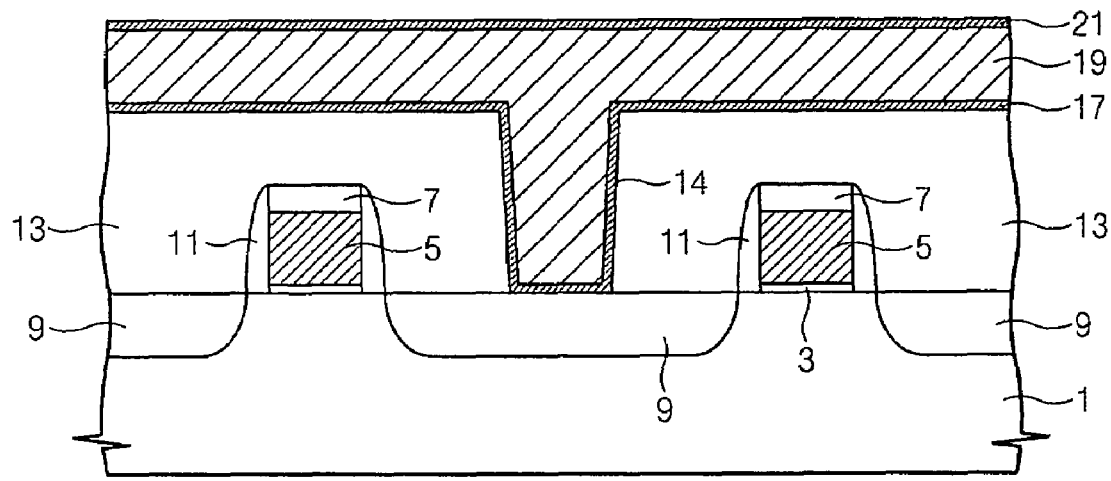

Referring to FIG. 9, a third tungsten layer 21 may formed on the second tungsten layer 19 to complete the structured tungsten layer. The third tungsten layer 21 may be formed directly on the second tungsten layer 19. The third tungsten layer 21 may be formed using the same ALD method as the first tungsten layer 17. Accordingly, the upper surface of the third tungsten layer 21 may be formed to be dense and smooth.

Figure 10:
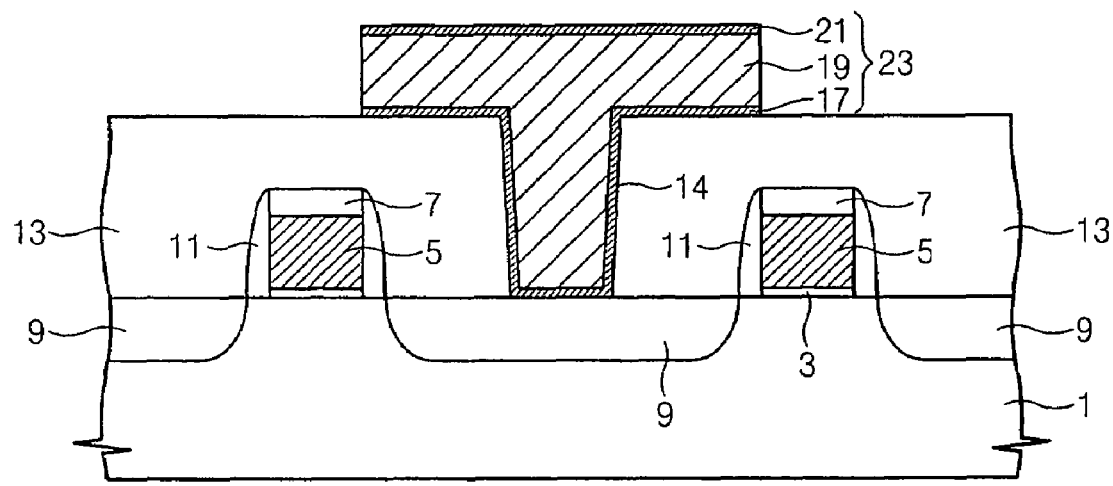

Referring to FIG. 10, the third tungsten layer 21, the second tungsten layer 19 and the first tungsten layer 17 may be sequentially etched, e.g., in one etching process, to form a structured tungsten pattern 23. The structured tungsten pattern 23 may form a contact plug connected with a pad or interconnections.

Figure 11:
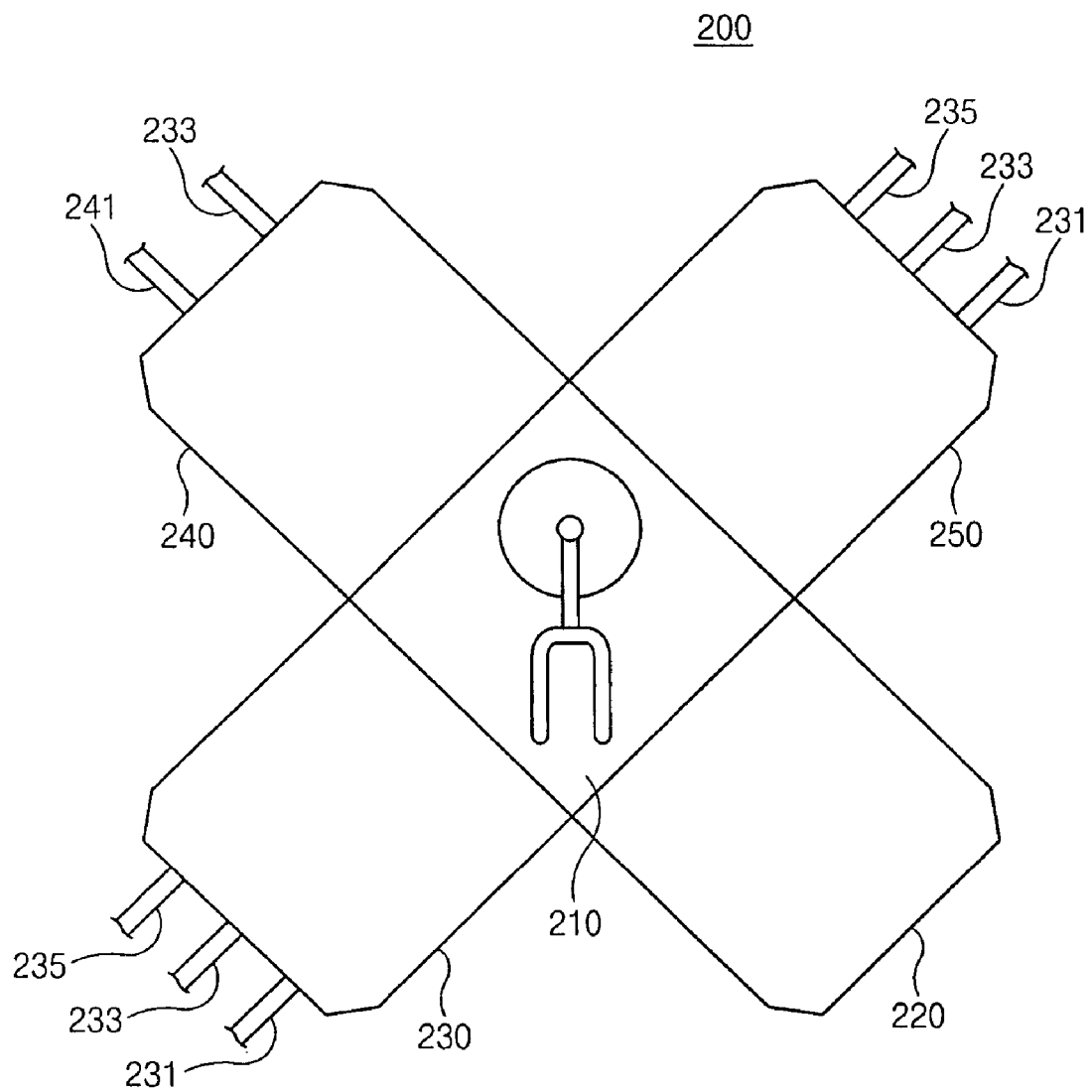
FIG. 11 illustrates an apparatus for forming a structured tungsten layer, in accordance with an embodiment of the present invention.

FIG. 11 illustrates an apparatus 200 for forming a structured tungsten layer, in accordance with an embodiment of the present invention. Referring to FIG. 11, the apparatus 200 may include a transfer chamber 210, a load lock chamber 220, a first process chamber 230, a second process chamber 240 and a third process chamber 250. The first process chamber 230 and the third process chamber 250 are preferably ALD chambers, and may include a monosilane supplying tube 231, a tungsten hexafluoride supplying tube 233 and an argon supplying tube 235. The second process chamber 240 is preferably a CVD, and may include a tungsten hexafluoride supplying tube 233 and a hydrogen supplying tube 241.

A method of forming a structured tungsten layer using apparatus 200 may be implemented as follows. A wafer upon which a structured tungsten layer is to be formed may be loaded to the load lock chamber 220. The loaded wafer may be transferred to the first process chamber 230 by a robot arm in the transfer chamber 210. The first tungsten layer may be formed in the first process chamber using the above-described ALD method. After the process is completed, the robot arm may transfer the wafer to the second process chamber 240. Preferably, only the second tungsten layer is formed in the second process chamber 240, using the above-described CVD process. After the process is completed, the robot arm may transfer the wafer to the third process chamber 250. The third tungsten layer may be formed by performing the above-described ALD process in the third process chamber 250 to complete the structured tungsten layer. Once all the processes are complete, the wafer may be transferred to the outside through the load lock chamber 220.

According to the methods of the present invention, i.e., a method for forming a structured tungsten layer and a method for forming a semiconductor device using the same, it may be possible to improve step coverage and throughput and prevent various process-related defects, e.g., contact failures, elevated interfacial resistance, etc.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for forming a structured tungsten layer on a semiconductor device, comprising:

forming a first tungsten layer on the semiconductor device using a first atomic layer deposition;

forming a second tungsten layer directly on the first tungsten layer using chemical vapor deposition;

forming a third tungsten layer directly on the second tungsten layer using a second atomic layer deposition; and sequentially etching the third tungsten layer, the second tungsten layer, and the first tungsten layer to form a structured tungsten pattern on the semiconductor device.

2. The method as claimed in claim 1, wherein forming the first and third tungsten layers includes repeating:

supplying a reducing gas;

purging by supplying a purge gas;

supplying a tungsten source gas; and purging by supplying a purge gas.

3. The method as claimed in claim 2, wherein forming the first and third tungsten layers comprises atomic layer deposition at a temperature ranging from about 300° C. to about 350° C.

4. The method as claimed in claim 2, wherein the reducing gas is at least one gas selected from the group consisting essentially of monosilane, disilane, silicon tetrafluoride, and dichlorosilane.

5. The method as claimed in claim 2, wherein the tungsten source gas includes is at least one of tungsten hexafluoride and tungsten carbon oxide.

6. The method as claimed in claim 2, wherein the purge gas includes at least one of nitrogen, argon, and helium.

7. The method as claimed in claim 1, wherein forming the second tungsten layer comprises chemical vapor deposition using hydrogen and tungsten hexafluoride.

8. The method as claimed in claim 7, wherein forming the second tungsten layer is performed at a temperature ranging from about 370° C. to about 420° C.

9. The method as claimed in claim 1, wherein forming the first tungsten layer, forming the second tungsten layer, and forming the third tungsten layer are each performed at a pressure ranging from about 36 to about 44 Torr.

10. A method for forming a semiconductor device comprising:
    forming an interlayer insulating layer on a semiconductor substrate;
    forming a first tungsten layer on the interlayer insulating layer using a first atomic layer deposition;
    forming a second tungsten layer directly on the first tungsten layer using chemical vapor deposition;
    forming a third tungsten layer directly on the second tungsten layer using a second atomic layer deposition; and
    sequentially etching the third tungsten layer, the second tungsten layer and the first tungsten layer to form a structured tungsten pattern on the interlayer insulating layer.

11. The method as claimed in claim 10, wherein:
    the interlayer insulating layer has a contact hole exposing the semiconductor substrate,
    the first tungsten layer is formed to conformally cover an inner surface of the contact hole, and
    the second tungsten layer is formed to completely fill the contact hole.

12. The method as claimed in claim 10, further comprising forming a contact plug to contact the semiconductor substrate through the interlayer insulating layer, prior to forming the first tungsten layer;
    wherein the structured tungsten pattern is formed to overlap and electrically couple to the contact plug.

13. The method as claimed in claim 10, wherein forming the first and third tungsten layers comprises sequentially repeating:
    supplying a reducing gas;
    purging by supplying a purge gas;
    supplying a tungsten source gas; and
    purging by supplying a purge gas.

14. The method as claimed in claim 13, wherein forming the first and third tungsten layers comprises atomic layer deposition at a temperature ranging from about 300° C. to about 350° C.

15. The method as claimed in claim 13, wherein the reducing gas includes at least one of monosilane, disilane, silicon tetrafluoride, and dichlorosilane.

16. The method as claimed in claim 13, wherein the tungsten source gas includes at least one of tungsten hexafluoride and tungsten carbon oxide.

17. The method as claimed in claim 13, wherein the purge gas includes at least one of nitrogen, argon, and helium.

18. The method as claimed in claim 10, wherein forming the second tungsten layer includes providing hydrogen and tungsten hexafluoride.

19. The method as claimed in claim 18, wherein forming the second tungsten layer is performed at a temperature ranging from about 370° C. to about 420° C.

20. The method as claimed in claim 10, wherein forming the first tungsten layer, forming the second tungsten layer, and forming the third tungsten layer are each performed at a pressure ranging from about 36 to about 44 Torr.

* * * * *